United States Patent
Bukofsky et al.

(10) Patent No.: US 6,891,169 B2
(45) Date of Patent: May 10, 2005

(54) ELECTRON BEAM ARRAY WRITE HEAD SYSTEM AND METHOD

(75) Inventors: Scott Josef Bukofsky, Hopewell Junction, NY (US); Bomy Able Chen, Cupertino, CA (US); Sara Jennifer Eames, Austin, TX (US); Qiang Wu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 10/348,658

(22) Filed: Jan. 21, 2003

(65) Prior Publication Data

US 2004/0140437 A1 Jul. 22, 2004

(51) Int. Cl.[7] .......................... H01J 37/30; H01J 29/70; H01J 29/72
(52) U.S. Cl. ................ 250/398; 250/423 F; 250/492.1; 313/336; 315/366
(58) Field of Search .............................. 250/398, 423 R, 250/423 F, 396 R, 492.1; 313/336, 304, 309, 351; 315/305, 366, 309

(56) References Cited

U.S. PATENT DOCUMENTS 5,363,021 A * 11/1994 MacDonald ................ 315/366
5,892,231 A * 4/1999 Baylor et al. ............... 250/398

* cited by examiner

*Primary Examiner*—John R. Lee
*Assistant Examiner*—David A. Vanore
(74) *Attorney, Agent, or Firm*—Jay H. Anderson

(57) ABSTRACT

An e-beam system generates a set of massively parallel beams of order of magnitude 1,000 by employing a flash eprom to store calibration data and to receive on/off signals directed through the address system of the memory array, the individual electron sources being mounted above the memory array in a geometric array that tracks the structure of the memory array.

11 Claims, 4 Drawing Sheets

CURRENT SOURCE

ELECTRON BEAM ARRAY WRITE HEAD SYSTEM AND METHOD

TECHNICAL FIELD

The field of the invention is that of electron beam systems using many beams in parallel.

BACKGROUND OF THE INVENTION

In the field of integrated circuits, the cost of reticles has become a significant portion of the total manufacture cost.

As circuit feature sizes become smaller, the number of pixels in a circuit increases and the cost of making reticles increases. The trend toward system on a chip ASICs and other forms of custom or semicustom chips has caused production runs to decrease in magnitude, so that the cost of a reticle set must be spread over a smaller number of chips sold.

The conventional form of electron beam, in which a single beam traces out the circuit elements while following a raster pattern has a cost structure that increases with the number of pixels.

A number of attempts have been made to employ parallel electron beams, typically limited to a small number (e.g. less than ten) because of the difficulty in providing a high quality magnetic field to provide the conventional demagnification ratio of four. Highly parallel configurations have been discussed, but have the obstacle that providing a way to focus, collimate, etc. the beams takes up space and that conflicts with the goal of putting a number of beams close together.

Attempts to produce massively parallel (meaning more than one thousand beams) systems have not resulted in commercially available systems. One problem that has not been solved in the art is that of adjusting individual beams to compensate for individual variations between beams and for the effects of use on the parameters of a beam, both of which are inherent in all known systems.

SUMMARY OF THE INVENTION

The invention relates to an e-beam system employing a massively parallel array of electron sources that are assembled by integrated circuit techniques together with systems for each beam to store calibration data and to control the individual beams using that calibration data.

A feature of the invention is the use of non-volatile memory to store calibration data.

Another feature of the invention is controlling individual electron sources using current sources controlled by the stored calibration data.

Yet another feature of the invention is the fabrication of a beam cell containing the data and the current sources, the beam cell having microscopic dimensions that fit within the transverse dimensions of an individual electron source within the array of electron sources.

DETAILED DESCRIPTION

Figure 1:
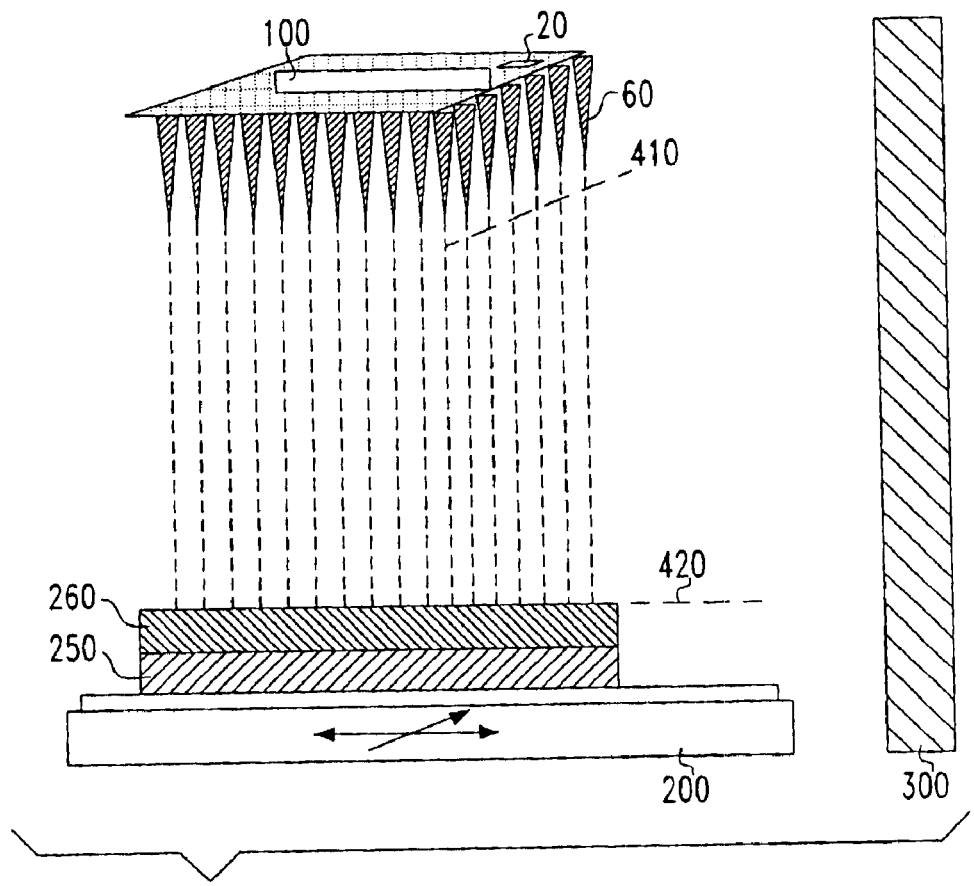
FIG. 1 shows an overall view of a system according to the invention.

FIG. 1 shows a perspective view of an example of the invention. At the top of the figure, integrated circuit 10 as explained in more detail later, contains a set of memory cells 20 that store data for adjustment of the parameters of individual e-beam sources. Below circuit 10, a set of tungsten points 60 emit individual e-beams (under control of controller 100) that travel downward in the figure toward photo resist 260 that coats a workpiece, such as a reticle blank 250. Workpiece 250 may also be a wafer in a version of the invention used for direct-write applications.

Figure 6:
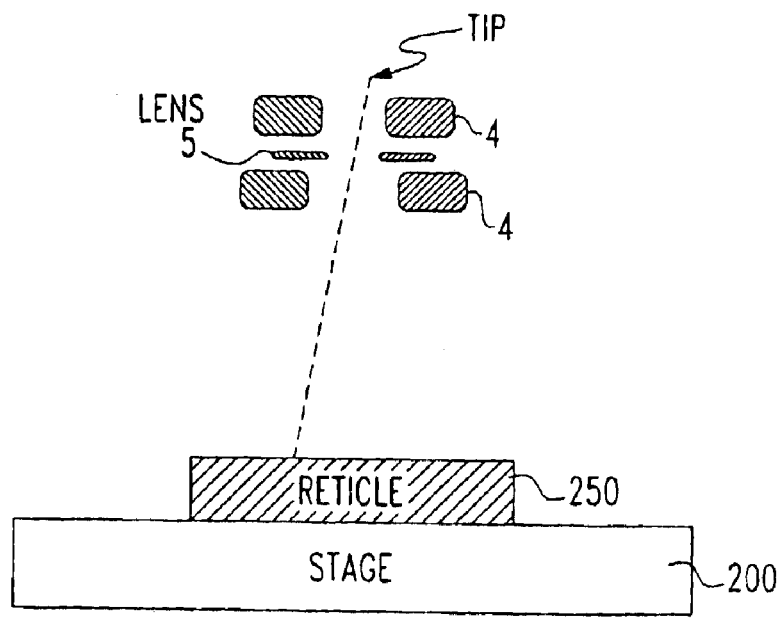
FIG. 6 shows a view of a prior art system.

It is an advantageous feature of the invention that the dimensions of an apparatus according to the invention are extremely small compared to the dimensions of conventional e-beam systems, such as that shown in FIG. 6, where a single beam travels through a pair of lenses 4, being defined by an aperture in a plate 5. The geometrical constrains of the lenses and aperture require that there be only one or a few beams in the system. In contrast, The transverse dimensions of a write head according to the invention will be comparable in size to the reticle of chip being written. Since the calibration data are stored within the unit that contains the write head, the head, once calibrated, can be stored waiting for the next time that a batch of reticles needs to be written, the calibration data being stored along with the head itself.

The workpiece is mounted on a precision movable stage 200 that can travel in both the x and y directions. On the right of the figure, box 300 represents schematically an optional magnetic lens system for focusing the set of beams and/or a set of electrostatic grids that control the potential distribution. The magnetic and electrostatic fields are options and not required. In the preferred embodiment, the distance between the tips 60 and the workpiece is as small as possible—illustratively between 10 micrometers and 1 or so millimeters, so that beam divergence is negligible and the expense of a magnetic lens field may be avoided.

As an example, the electrostatic field near the tips of sources 60 may be maintained by grid 410 at a value suitable for emitting electrons. Another value suitable for attracting the electrons to the workpiece may be imposed with grid 420 at the top surface of the photo resist. Illustratively, the total potential difference is in the range of 15–100V, typical of a voltage range used for flash eproms.

In operation, the set of sources will emit a set of parallel beams under control of a control system 100, which may be a general purpose computer, and the stage moves beneath it. As a simplified example, if the distance between sources 60 is 1 micrometer, there will be 1,000 sources per 1 mm of length.

One row of sources could be used, but preferably, there will be a convenient number of rows extending in the direction of the stage travel. This permits the pattern to be written more than once to average out location errors and/or to increase the speed by having each row write a separate portion of the circuit. In an extreme case, where the dimension of circuit 10 is the same as that of the pattern being written, the stage would step once over the distance between sources (e.g. 500 nm). If a pixel is 10 nm on a side, there will be 50 pixels in the 500 nm range covered by a source or row of sources.

Figure 2:
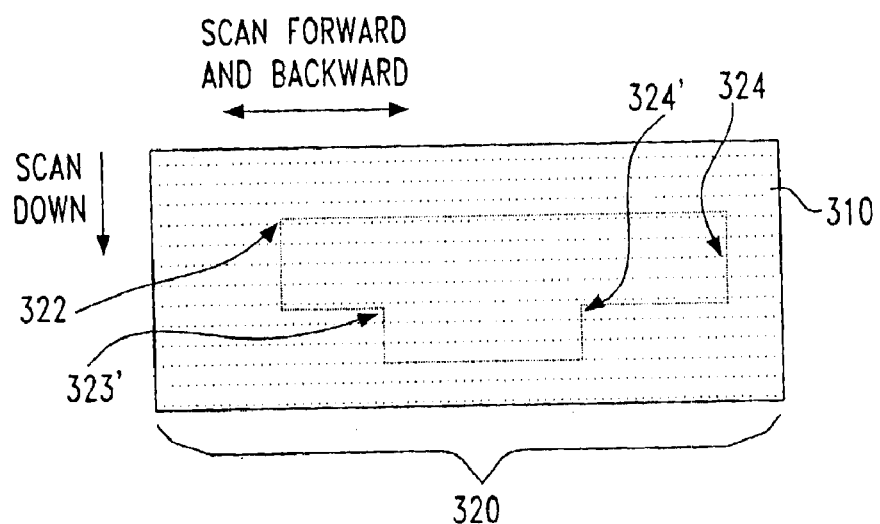
FIG. 2 shows a portion of a pattern written by the system.

In FIG. 2, bracket 320 represents the range of the ith source. Horizontal lines 310 illustrate the raster pattern within which the data is written. The stage may scan to the left and right to traverse the width of the workpiece and also scan downward in the figure to traverse the length. Since reticles are conventionally four times the size of the final chip, the embodiment illustrated has the capability of scanning in both directions. As a design choice, the chip could be made the full width of the workpiece, so that only a vertical (in the drawing) scan is required. Such a dimensional arrangement realizes to the full the advantage of parallelism—the great increase in speed possible from writing thousands of pixels at the same time, rather than sequentially.

Illustratively, the data storage circuity associated with the set of sources is organized as a memory array. In that case, control of the beams may simply be effected by sending signals through the conventional memory address of the individual beam in question, thus taking advantage of the engineering that has previously been done to create memory chips. Referring again to FIG. 2, edges 322 on the left of the shape being written indicate distances where the beams start writing. This is effected by sending an "on" signal to the relevant addresses of the individual sources. Likewise, edges 324 where the pattern stops are defined by sending on "off" signal to the relevant addresses. Thus, to write the pattern illustrated, the workpiece is scanned vertically in the drawing. When the top edge of the shape is reached, the addresses in the range between 322 and 324 are turned on and the beams within that range start writing. When the edge of the wide portion of the shape is reached, the beams outside the sub-range 322' to 342' are turned off and the beams within the subrange remain on.

Figure 3:
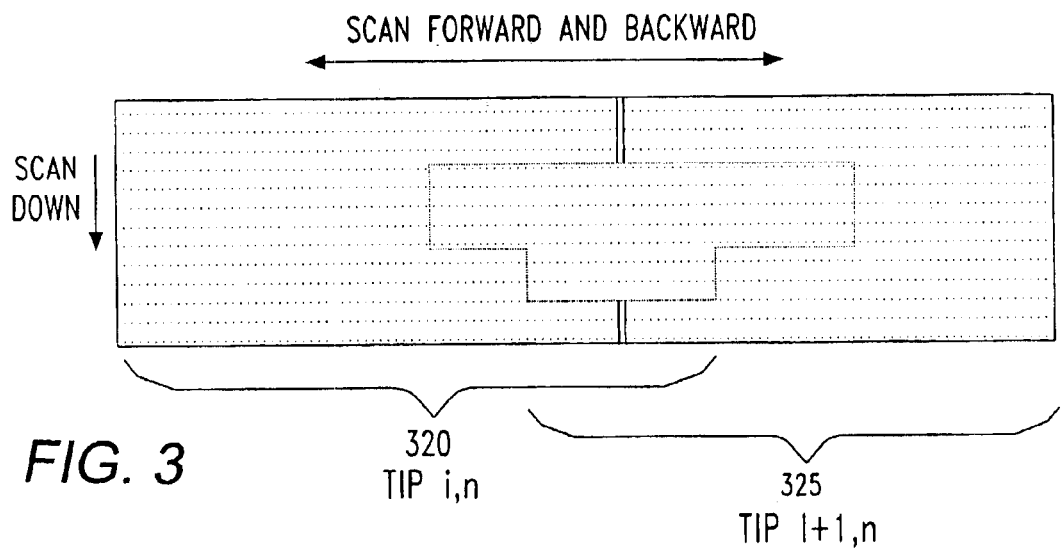
FIG. 3 shows an overlapping region between the patterns written by adjacent sources.

In such a parallel system, there is always an alignment problem at the join where one range meets the adjacent one. Referring now to FIG. 3, the overlap between brackets 320 and 325 indicates such a join area, also indicated by the oval. In that area, illustratively, the beams are controlled so that each gives half the usual dose, thus providing the photo resist in that area with the correct dose for exposure. Various mechanisms for delivering such a dose will be discussed below.

Figure 4A:
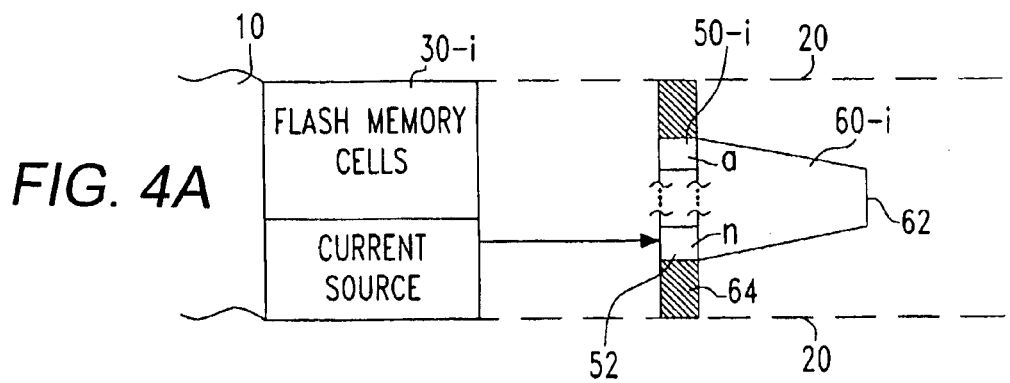
FIG. 4A shows a partially schematic, partially pictorial view of an individual electron beam cell.

FIG. 4A shows in partially schematic, partially pictorial form an individual cell in circuit 10. The ith cell illustratively contains one or more flash memory cells 30-$i$ that store data resulting from calibration tests on the properties of the individual cell e.g. the amount of current that it emits during a "flash" of standard duration. The ith current source is controlled by the stored data to send the correct amount of current to the emitting tip 60-$i$. Tip 60-$i$ is illustratively deposited on a set of electrodes 50-$i$ that are formed in the top layer of integrated circuit 10 by conventional techniques. As discussed below, several electrodes, each connected to a source of current, are connected to a single tip 60. The several electrodes are denoted in the Figure by letters a–n This permits variation in the amount of current fed through a tip in a flash by simply turning on or off as many current sources as are required. In addition, there may be spare current sources in order to provide redundancy for replacement of defective cells and/or current supplies.

Figure 7:
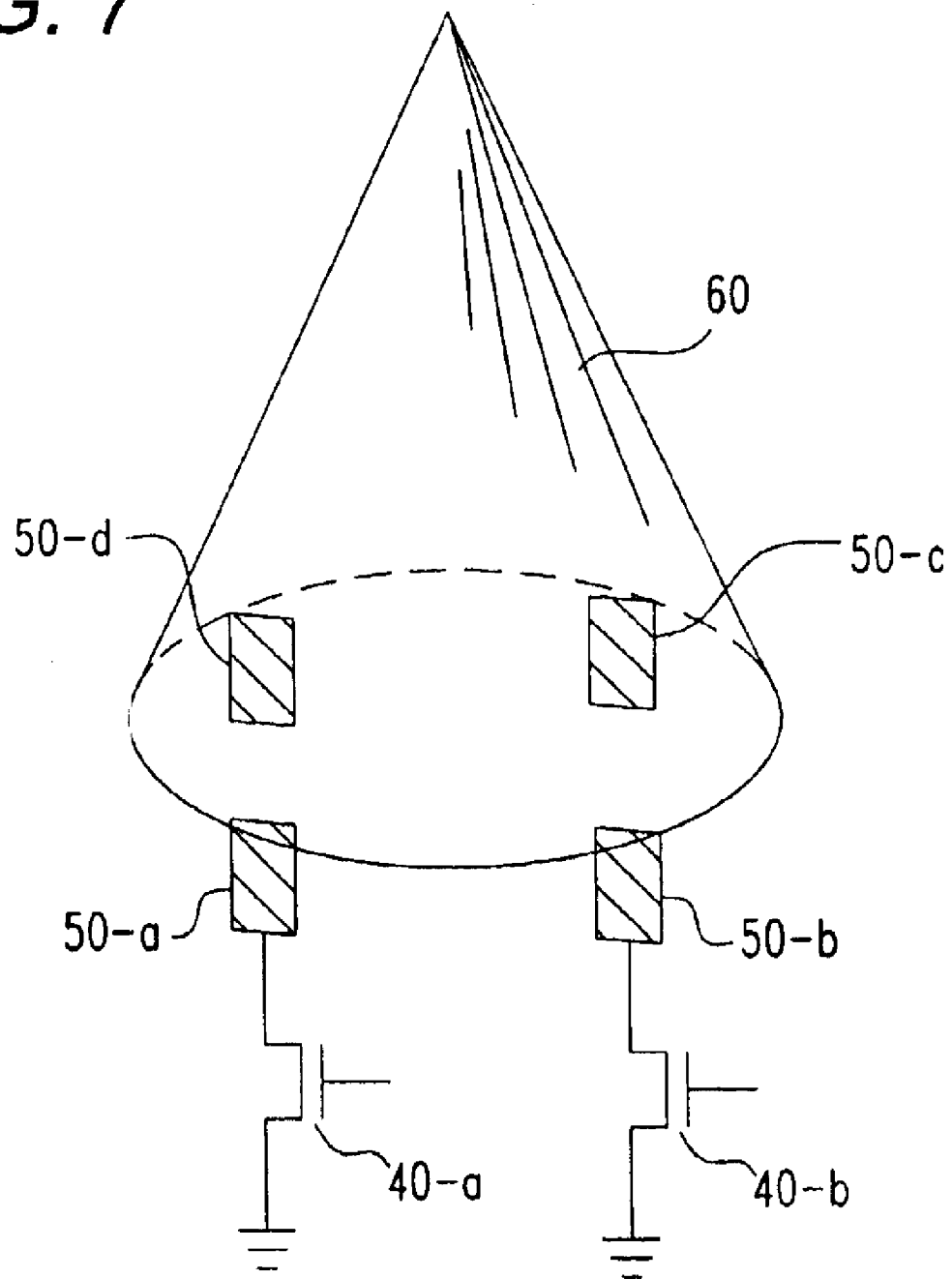
FIG. 7 shows a perspective view of the connection between the emitting tips and current sources.

Tips 60 are illustratively formed from a layer of material, e.g. Tungsten that is 5 $\mu$m to 50 $\mu$m thick and are shaped by a conventional process of erosion etching to have a tip emitting surface 62. Tip 62 is drawn as flat to illustrate that a perfect point is impossible to manufacture and that there will be a finite width to the tips. The areas 64 at the top and bottom of the figure illustrate insulators that isolate adjacent cells. Dotted lines 20 indicate the boundary of the ith cell. FIG. 7 shows an alternate view of this arrangement, in which a set of electrodes 50 are driven by currents sources 40 and are in mechanical and electrical contact with tip 60. The number of electrodes 50 per cell will be set by the designer as discussed elsewhere.

In construction, the current module will be formed by standard integrated circuit techniques in a semiconductor substrate 10. The memory cells and current sources will be formed from a set of flash memory cells required to store the data for that current module and a set of current sources arranged within the boundaries of the current module. Conductive members will extend vertically from substrate 10 (to the right in the Figure) to the plane of electrodes 50-$i$. Conventional back end dielectric layers will be put down to provide support for tips 60 and vias will be etched through the dielectric to provide the conductive paths, using conventional integrated circuit techniques.

Figure 4B:
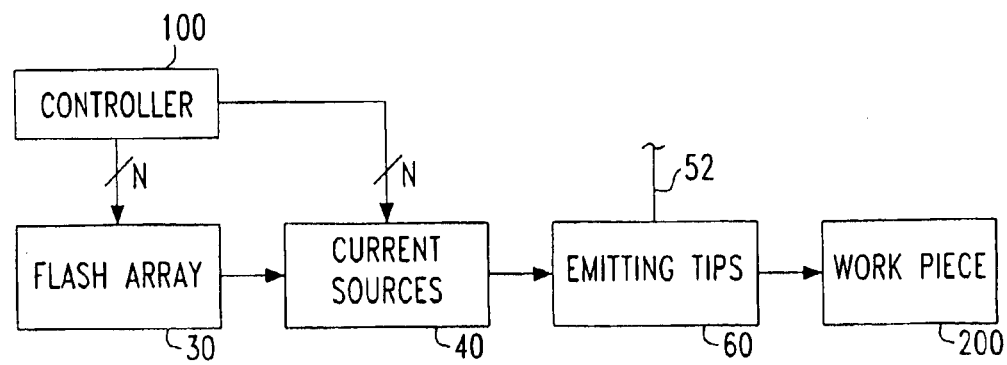
FIG. 4B shows a block diagram of the cell of FIG. 4A.

FIG. 4B shows a block diagram of the ith cell. At the top, controller 100, which is common to all the cells (and may be a general purpose CPU), sends signals to the flash array 30 and the current sources 40. For example, the ith cell could contain a set of one-bit flash memory cells sufficient to store the data.

Advantageously, the magnitude of the voltages required to write in a flash memory cell are the same as those for the beam acceleration, so that the technology of handling voltages in the rages of tens to 100 volts can be used for both the data storage and for the beams.

In operation the cells 30 contain data on the magnitude-of the charge to be delivered and, at the correct time for the pattern being written, controller 100 sends on (and, optionally, off) signals to the current sources 40, using the address technology for the flash eprom structure that the cells are contained within.

As a design choice, controller 100 may send signals indicating when a pixel comes within range and whether the full charge (or a one half charge in an overlap region) is to be delivered. The individual modules then control the current magnitude and/or duration to deliver the adjusted charge, adjusted for individual variation between current modules and for aging.

Those skilled in the art will readily be able to design control systems that use stored data to control the duration of a standard-magnitude current to achieve the result of adjusting the total number of electrons delivered to a pixel; i.e. if the ith current module is to deliver $Q_i$ microcoulombs, the controller sends an "on" signal, the current sources 40 are turned on for a length of time controlled by a timing circuit within the cell that reads the stored data to determine when to turn the current sources within the module off. Illustratively, the timing circuit is contained within the box labeled 40 representing the current source and controls for each source.

Figure 5:
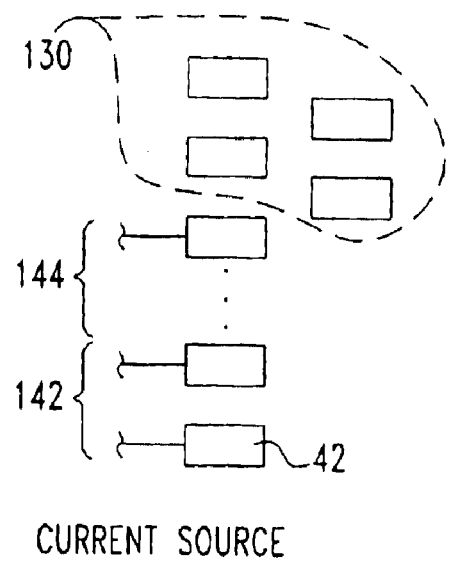
FIG. 5 shows a block diagram of a current source for use with the invention.

Referring now to FIG. 5, there is shown a simple example of a current control. Two brackets 142 and 144 denote two sets of current sources 42 that are all turned on or off at the same time. A dotted line 130 surrounds individual controllable current sources. In operation, an on signal from controller 100 turns on all the sources 142 and 144 and those of sources 130 that have on signals stored in the memory cells. This set of sources delivers a current that varies from one module to another until an off signal is received (or a standard time has elapsed).

As a specific example, each of groups 142 and 144 contain four sources, so the range of current available is eight from groups 142 and 144 plus 0 to 4 from group 130. Thus, the range is 8 to 12 or 10 plus or minus 20%. Calibration data permits the adjustment of individual beam within that plus or minus 20% range, by means of stored data in the flash memory cells. Those skilled in the art can readily increase the number of current sources to provide finer control and/or to provide redundancy.

The requirement of reducing current in the overlap region where beam spatial ranges overlap is addressed by turning off one of groups 142 or 144 in the overlap range.

Another method of charge control is the use of a multi-bit (having several voltage levels in a cell, not just two) flash memory that is commercially available. A circuit within the current module reads the stored data and either uses analog techniques to control current or duration of converts the stored analog data to digital data and uses one of the preceding examples.

While the invention has been described in terms of a single preferred embodiment, those skilled in the art will recognize that the invention can be practiced in various versions within the spirit and scope of the following claims.

What is claimed is:

1. A system for writing a pattern on a workpiece using a set of electron beams comprising:
    a set of sources for generating a set of electron beams;
    accelerating means for accelerating said set of electron beams toward said workpiece;
    scanning means for moving said workpiece relative to said sources;
    storage means for storing calibration data on each source;
    controller means for controlling said set of electron beams in accordance with said pattern; in which:
    said set of sources comprises an array of at least one thousand sources;
    said storage means for storing calibration data comprises at least one memory cell for each source, said at least one memory cell and said source being disposed within a common module; and
    said common module comprises an integrated circuit having said memory cells formed in a semiconductor substrate and said sources being disposed within said integrated circuit.

2. A system according to claim 1, in which each module comprises current control means for controlling the amount of electrons emitted by said module.

3. A system according to claim 2, in which said current control means includes memory means for storing data representing said amount of electrons emitted by said module and means for controlling the duration of at least one current source within said module.

4. A system according to claim 2, in which said current control means includes memory means for storing data representing said amount of electrons emitted by said module and means for controlling the magnitude of current emitted by at least one current source within said module.

5. A system according to claim 1, in which each module comprises a set of current means connected in parallel to a current emitting source.

6. A system according to claim 1, in which said modules are positioned with respect to said workpiece such that the distance between emitting surfaces of said current emitting sources and said workpiece is limited such that beam divergence is below a divergence threshold.

7. A system according to claim 1, further comprising means for moving at least one of said array of sources and said workpiece to cover a pattern area.

8. A system according to claim 7, in which said array of sources covers a first dimension of said workpiece, whereby said means for moving at least one of said array of sources and said workpiece to cover a pattern area steps along a second dimension of said pattern area.

9. A system according to claim 7, in which said array of sources covers a length less than a first dimension of said workpiece, whereby said means for moving at least one of said array of sources and said workpiece to cover a pattern area makes at least two passes along a second dimension of said pattern area.

10. A system according to claim 7, in which said array of sources has at least two rows along a first dimension of said workpiece, whereby said means for moving at least one of said array of sources and said workpiece to cover a pattern area may makes a pass along a second dimension of said pattern area that is less than the total length thereof.

11. A system according to claim 9, in which said array of sources has at least two rows along a first dimension of said workpiece, whereby said means for moving at least one of said array of sources and said workpiece to cover a pattern area may makes a pass along a second dimension of said pattern area that is less than the total length thereof.

* * * * *